United States Patent
Kimura et al.

(10) Patent No.: US 7,521,361 B2
(45) Date of Patent: Apr. 21, 2009

(54) METHOD FOR MANUFACTURING WIRING SUBSTRATE

(75) Inventors: Satoshi Kimura, Fujimi (JP); Hidemichi Furihata, Chino (JP); Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 84 days.

(21) Appl. No.: 11/680,801

(22) Filed: Mar. 1, 2007

(65) Prior Publication Data

US 2007/0212876 A1 Sep. 13, 2007

(30) Foreign Application Priority Data

Mar. 10, 2006 (JP) ............................. 2006-065985

(51) Int. Cl.
   *H01L 21/44* (2006.01)
(52) U.S. Cl. ................. 438/678; 438/674; 438/686; 438/903; 438/906; 257/E21.175; 257/E21.586
(58) Field of Classification Search ................. 438/493, 438/496, 497, 500, 523, 641, 650, 903; 257/E21.464
   See application file for complete search history.

(56) References Cited

U.S. PATENT DOCUMENTS 4,970,571 A * 11/1990 Yamakawa et al. .......... 257/737
2002/0182308 A1 * 12/2002 Lee et al. ....................... 427/98
2003/0214038 A1 * 11/2003 Nemoto ....................... 257/738
2005/0218487 A1 * 10/2005 Kimura et al. .............. 257/676

FOREIGN PATENT DOCUMENTS

| JP | 10-065315 | 3/1998 |
| JP | 2005-223062 | 8/2005 |
| JP | 2005-223063 | 8/2005 |
| JP | 2005-223064 | 8/2005 |
| JP | 2005-223065 | 8/2005 |
| JP | 2005-286138 | 10/2005 |

* cited by examiner

*Primary Examiner*—Walter L Lindsay, Jr.
*Assistant Examiner*—Cheung Lee
(74) *Attorney, Agent, or Firm*—Harness, Dickey & Pierce, P.L.C.

(57) ABSTRACT

A method for manufacturing a wiring substrate by an electroless plating method that precipitates metal without using a plating resist is provided. The method includes the steps of: (a) providing a catalyst layer having a predetermined pattern on a substrate; (b) dipping the substrate in an electroless plating solution to thereby precipitate metal on the catalyst layer to provide a first metal layer; (c) washing a top surface of the substrate with water; and (d) dipping the substrate in an electroless plating solution to thereby precipitate metal on the first metal layer to provide a second metal layer.

15 Claims, 6 Drawing Sheets

METHOD FOR MANUFACTURING WIRING SUBSTRATE

The entire disclosure of Japanese Patent Application No. 2006-065985, filed Mar. 10, 2006 is expressly incorporated by reference herein.

BACKGROUND

1. Technical Field

The present invention relates to methods for manufacturing wiring substrates.

2. Related Art

The additive methods attract attention as methods for manufacturing wiring substrates along with improvements in electronic devices for higher speed and higher density integration in recent years. Among the additive methods, the following method is well known. Namely, photoresist that is provided on a substrate is patterned to form a resist layer, and a plating processing is applied at an opening section provided in the resist layer whereby a layer of metal is precipitated at the opening section.

According to the method described above, the step of removing the plating resist is eventually required, which results in a greater number of manufacturing steps. In this respect, a method that precipitates metal in a layer without using a plating resist is attracting attention. Japanese laid-open patent application JP-A-10-65315 describes an example of related art.

SUMMARY

In accordance with an advantage of some aspects of the invention, it is possible to provide a method for manufacturing a wiring substrate which can accurately form wirings in high density without using plating resist.

A method for manufacturing a wiring substrate in accordance with an embodiment of the invention pertains to a method for manufacturing a wiring substrate by an electroless plating method that precipitates metal without using a plating resist, and includes the steps of (a) providing a catalyst layer having a predetermined pattern on a substrate; (b) dipping the substrate in an electroless plating solution to thereby precipitate metal on the catalyst layer to provide a first metal layer; (c) washing a top surface of the substrate with water; and (d) dipping the substrate in an electroless plating solution to thereby precipitate metal on the first metal layer to provide a second metal layer.

Concretely, an "electroless plating method that precipitates metal without using a plating resist" is a plating method that is conducted without providing a resist on a substrate when dipping the substrate in an electroless plating solution. The "plating resist" is a material that covers a predetermined portion on the substrate in order to prevent a plating process from acting on the portion, and is normally composed of a material that does not react to an electroless plating solution.

According to the method for manufacturing a wiring substrate in accordance with the present embodiment, precipitation of metal in a plane direction of the substrate is delayed, and a metal layer can be grown in a thickness direction thereof, such that gaps between wiring patterns can be prevented from being embedded by the metal layer. Accordingly, high-density wirings can be accurately formed, and reliability of the wiring substrate can be improved.

In the method for manufacturing a wiring substrate in accordance with an aspect of the embodiment of the invention, the step (c) and the step (d) may be repeatedly conducted.

The method for manufacturing a wiring substrate in accordance with an aspect of the embodiment of the invention may further include the step (e) of removing moisture on the substrate between the step (c) and the step (d).

In the method for manufacturing a wiring substrate in accordance with an aspect of the embodiment of the invention, the step (c), the step (e) and the step (d) may be repeatedly conducted.

The method for manufacturing a wiring substrate in accordance with an aspect of the embodiment of the invention may further include the step (f) of washing the top surface of the substrate between the step (e) and the step (d).

In the method for manufacturing a wiring substrate in accordance with an aspect of the embodiment of the invention, the step (c), the step (e), the step (f) and the step (d) may be repeatedly conducted.

In the method for manufacturing a wiring substrate in accordance with an aspect of the embodiment of the invention, the step (e) may include blowing air onto the substrate to thereby remove moisture.

In the method for manufacturing a wiring substrate in accordance with an aspect of the embodiment of the invention, a dipping time in the step (d) may be less than a dipping time in the step (b).

In the method for manufacturing a wiring substrate in accordance with an aspect of the embodiment of the invention, a dipping time in the step (d) that is conducted at an n-th time may be less than a dipping time in the step (d) that is conducted at an (n−1)th time.

In the method for manufacturing a wiring substrate in accordance with an aspect of the embodiment of the invention, in the step (c), the top surface of the substrate may be washed with water at a temperature lower than a temperature of the electroless plating solution.

In the method for manufacturing a wiring substrate in accordance with an aspect of the embodiment of the invention, the step (a) may include the steps of: (a1) providing a resist layer in a region other than a desired wiring pattern on the substrate; (a2) providing a surface-active agent layer including a surface-active agent on the substrate; (a3) providing a catalyst layer on the surface-active agent layer; and (a4) removing the resist layer to thereby remove the surface-active agent layer and the catalyst layer in the region other than the desired wiring pattern.

DESCRIPTION OF EXEMPLARY EMBODIMENTS

Preferred embodiments of the invention are described below with reference to the accompanying drawings.

1. First Embodiment

1.1 Method for Manufacturing Wiring Substrate

Figure 1:
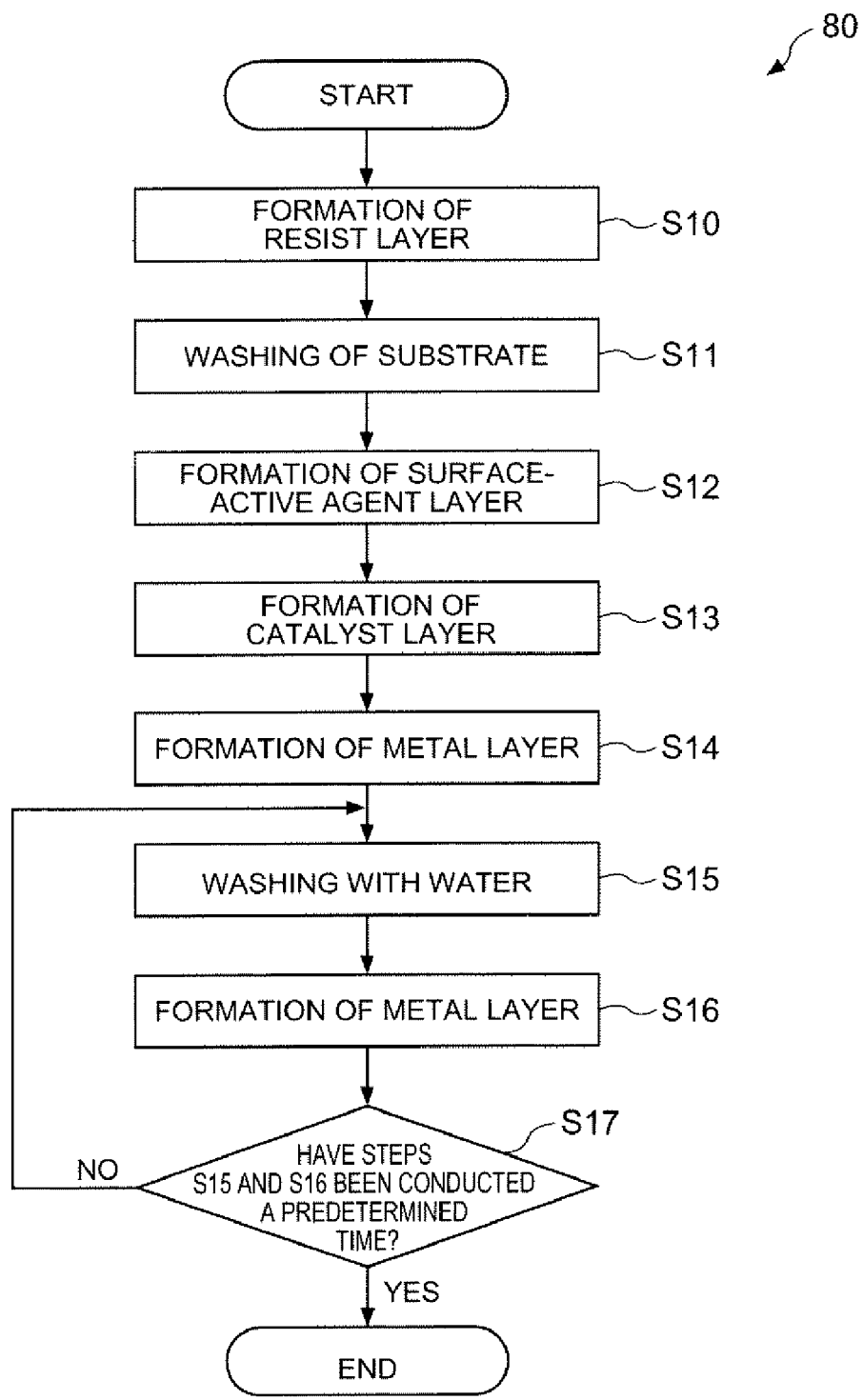
FIG. 1 is a flow chart showing an outline of a method for manufacturing a wiring substrate in accordance with a first embodiment of the invention.

FIG. 1 is a flow chart 80 showing an outline of a method for manufacturing a wiring substrate in accordance with an embodiment of the invention. FIGS. 2-10 are views showing steps of a method for manufacturing a wiring substrate 100 (see FIG. 10) in accordance with a first embodiment. According to the present embodiment, the wiring substrate is manufactured by using electroless plating.

(1) First, a substrate 10 is prepared. The substrate 10 shown in FIG. 2 may be a dielectric substrate. The substrate 10 may be an organic material substrate (such as, for example, a plastic material substrate or a resin substrate), or an inorganic material substrate (such as, for example, a silica glass plate, a silicon wafer or an oxide layer). As the plastic material, polyimide, polyethylene terephthalate, polycarbonate, polyphenylene sulfide and the like can be enumerated. The substrate 10 may be a light transmissive substrate (for example, a transparent substrate). The substrate 10 may be in a single layer, or in a multilayer in which at least one dielectric layer is formed on a base substrate. In the present embodiment, a metal layer is formed on the substrate 10.

Figure 2:
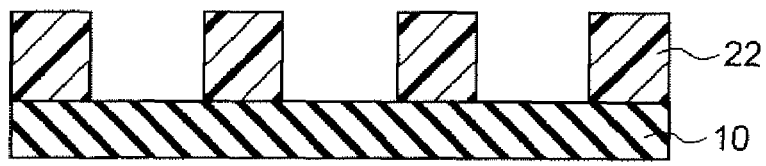
FIG. 2 is a view showing a step of the method for manufacturing a wiring substrate in accordance with the first embodiment.
Figure 3:
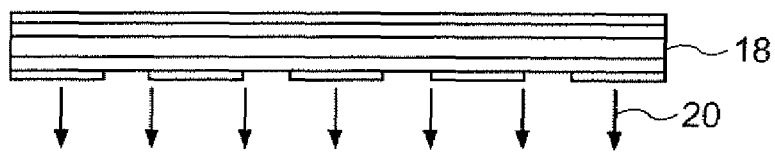
FIG. 3 is a view showing a step of the method for manufacturing a wiring substrate in accordance with the first embodiment.
Figure 3:

Then, a resist layer 22 is formed (step S10). After coating resist (not shown) on a top surface of the substrate 10, the resist is patterned by a lithography technique, whereby the resist layer 22 is formed, as shown in FIG. 2. It is noted that the resist layer 22 is formed in a region other than a desired wiring pattern.

(2) Next, the substrate 10 is washed (step S11). The substrate 10 may be washed by either dry washing or wet washing, and may preferably be washed by dry washing. When the substrate 10 is washed by dry washing, damage such as exfoliation that may occur on the resist layer 22 can be prevented.

By using a vacuum ultraviolet ray lamp, the dry etching on the substrate 10 can be conducted in a nitrogen atmosphere for 30 seconds-900 seconds by irradiating vacuum ultraviolet ray. By washing the substrate 10, dirt such as grease adhered to the surface of the substrate 10 can be removed. Also, the surface of the substrate 10 and the resist layer 22 can be changed from water-repelling property to hydrophilic property. Furthermore, if the surface potential in liquid of the substrate 10 is a negative potential, a uniform negative potential surface can be formed on the substrate 10 by washing the substrate 10.

In the case of the wet washing, for example, the substrate 10 may be dipped in ozone water (with an ozone concentration of 10 ppm-20 ppm) for about 5 minutes-30 minutes at room temperature, to thereby wash the substrate 10. The dry washing on the substrate 10 can be conducted by using a vacuum ultraviolet ray lamp (with a wavelength of 172 nm, an output of 10 mW, and a lamp-to-substrate distance of 1 mm), in a nitrogen atmosphere for 30 seconds-900 seconds by irradiating vacuum ultraviolet ray.

Figure 4:
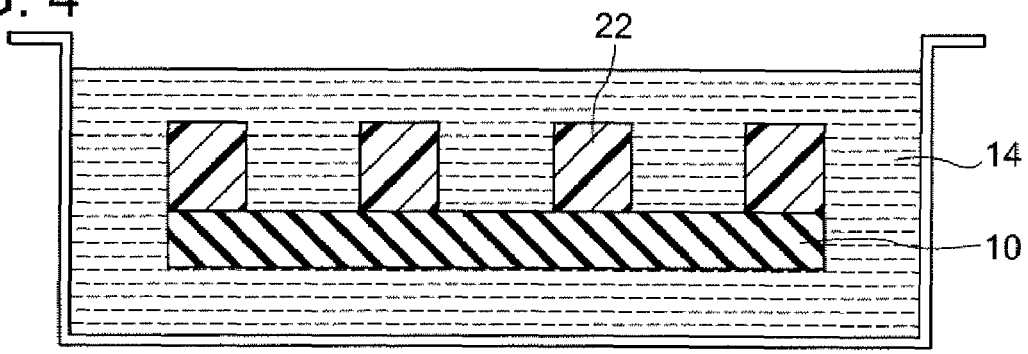
FIG. 4 is a view showing a step of the method for manufacturing a wiring substrate in accordance with the first embodiment.
Figure 5:
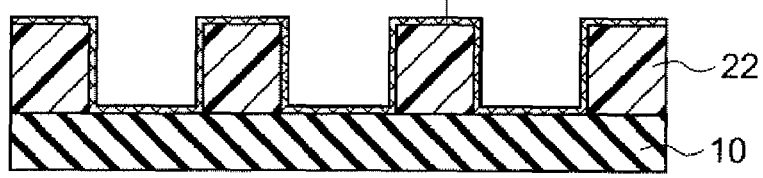
FIG. 5 is a view showing a step of the method for manufacturing a wiring substrate in accordance with the first embodiment.

(3) Next, as shown in FIG. 4, the substrate 10 is dipped in a surface-active agent solution 14. A surface-active agent contained in the surface-active agent solution 14 may be a cationic system surface-active agent or an anionic system surface-active agent. When the surface potential in liquid of the substrate 10 is a negative potential, a cationic system surface-active agent may be used. This is because the cationic system surface-active agent is readily adsorbed to the substrate 10, compared to other surface-active agents. On the other hand, when the surface potential in liquid of the substrate 10 is a positive potential, an anionic system surface-active agent may preferably be used as the surface-active agent contained in the surface-active agent solution 14.

As the cationic system surface-active agent, for example, a water-soluble surface-active agent containing aminosilane composition, an alkylammonium surface-active agent (for example, cetyltrimethylammonium chloride, cetyltrimethylammonium bromide, cetyldimethylammonium bromide, or the like), or the like can be used. As the anionic system surface-active agent, polyoxyethylenealkylethersulfate (sodiumdodecylsulfate, lithiumdodecylsulfate, N-lauroylsarcosine or the like) may be used. The dipping time may be, for example, about 1 minute to about 10 minutes.

Then, the substrate 10 is taken out of the surface-active agent solution, and washed with ultrapure water. Then, the substrate may be naturally dried at room temperature, or water droplets on the substrate 10 may be removed by blowing compressed air, and then the substrate 10 is placed and dried in an oven at 90° C.-120° C. for about 10 minutes to about 1 hour. By the steps described above, a surface-active agent layer 24 can be provided on the substrate 10 (step S12). In this instance, when a cationic surface-active agent is used as the surface-active agent, the surface potential in liquid of the substrate 10 shifts more to a positive potential side than before the surface-active agent is adsorbed to the surface.

Figure 6:
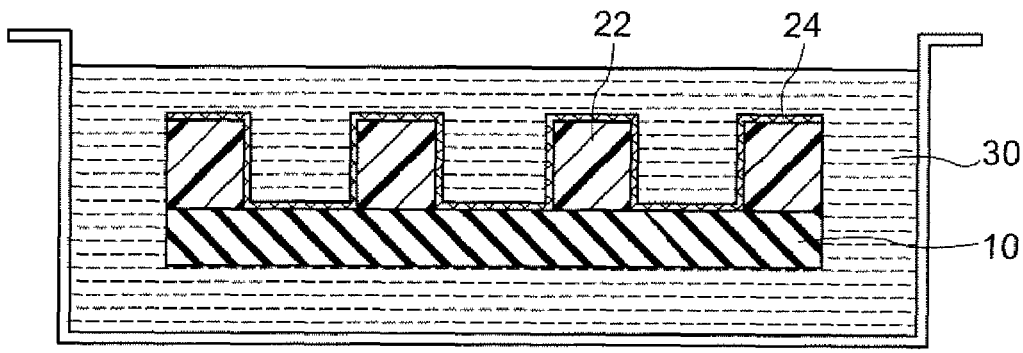
FIG. 6 is a view showing a step of the method for manufacturing a wiring substrate in accordance with the first embodiment.

(4) Then, as shown in FIG. 6, the substrate 10 is dipped in a catalyst solution 30. The catalyst solution 30 contains catalyst composition that functions as a catalyst for electroless plating. As the catalyst composition, for example, palladium may be used.

For example, the catalyst solution 30 may be made according to the following methods.

(4a) Palladium pellets with a purity of 99.99% are dissolved in a mixed solution of hydrochloric acid, hydrogen peroxide solution and water, to form a palladium chloride solution with a palladium concentration of 0.1-0.5 g/liter.

(4b) The palladium chloride solution described above is further diluted with water and hydrogen peroxide solution to adjust the palladium concentration to 0.01-0.05 g/liter.

(4c) pH of the palladium chloride solution is adjusted with a sodium hydroxide solution to 4.5-6.8.

After dipping the substrate 10 in the catalyst solution 30, the substrate 10 may be washed with water. The washing with water may be conducted with pure water. By the washing with water, residues of the catalyst can be prevented from mixing in an electroless plating solution to be described below.

Figure 7:
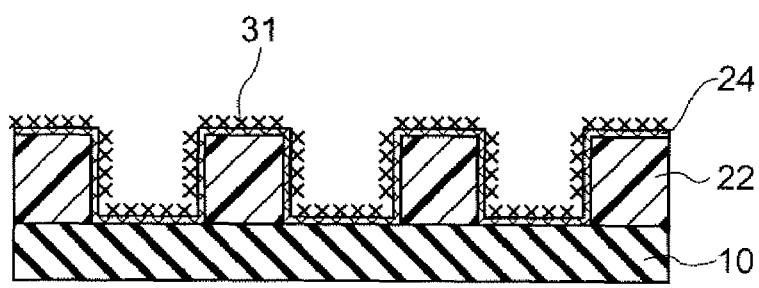
FIG. 7 is a view showing a step of the method for manufacturing a wiring substrate in accordance with the first embodiment.

By the steps described above, a catalyst layer 31 is formed. The catalyst layer 31 is formed on the surface of the substrate 10 and on the surface-active agent layer 24 on the resist layer 22, as shown in FIG. 7.

Figure 8:
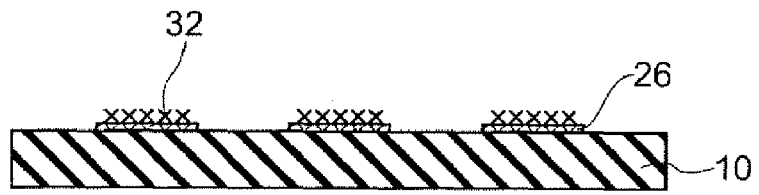
FIG. 8 is a view showing a step of the method for manufacturing a wiring substrate in accordance with the first embodiment.

Then, as shown in FIG. 8, the resist layer 22 is removed, and a surface-active agent layer 26 and a catalyst layer 32 having a desired wiring pattern (step S13) are formed. It is noted that the resist layer 22 can be removed by using acetone or the like. The surface-active agent layer 24 and the catalyst layer 31 provided on the resist layer 22 are also removed together with the resist layer 22.

Figure 9:
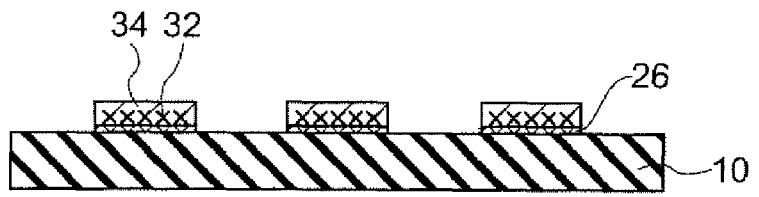
FIG. 9 is a view showing a step of the method for manufacturing a wiring substrate in accordance with the first embodiment.

(5) Next, a first metal layer 34 is precipitated on the catalyst layer 32, as shown in FIG. 9. Concretely, the substrate 10 is dipped in an electroless plating liquid, whereby the first metal layer 34 can be precipitated on the catalyst layer 32. If a nickel layer is to be precipitated as the first metal layer 34, an electroless plating liquid mainly containing nickel sulfate hexahydrate with sodium hypophosphite included therein as a reducing agent may be used. For example, by dipping the substrate 10 in such an electroless plating liquid (at 70-80° C.) for about 10 seconds to about 5 minutes, a nickel layer having a thickness of 0.01 μm-0.1 μm can be formed. Alternatively, an electroless plating liquid mainly containing nickel chloride hexahydrate with sodium hypophosphite included therein as a reducing agent may be used. Without being limited to any particular material, the first metal layer 34 can be formed with any material that causes a plating reaction by catalyst, for example, platinum (Pt), copper (Cu), gold (Au) or the like. In this manner, the first metal layer 34 having a desired thickness (of about 5-50% of the total thickness of a metal layer 33) can be formed on the top surface of the catalyst layer 32 on the substrate 10 (step S14).

(6) Next, the substrate 10 is washed with water (step S15). The washing with water can be conducted by, for example, dipping the substrate 10 in pure water. By the washing with water, the electroless plating liquid adhered to the substrate 10 can be removed or diluted. The temperature of the water used for washing may preferably be lower than the temperature of the electroless plating liquid, and may be room temperature.

(7) Then, a second metal layer 36 is precipitated on the first metal layer 34. Concretely, by dipping the substrate 10 in an electroless plating liquid, the second metal layer 36 can be precipitated. As the electroless plating liquid, an electroless plating liquid similar to the electroless plating liquid described above may be used. For example, by dipping the substrate 10 in such an electroless plating liquid (at 70-80° C.) for about 5 seconds to about 5 minutes, a nickel layer having a thickness of 0.01 μm-0.1 μm can be formed.

The dipping time for forming the second metal layer 36 may preferably be shorter than the dipping time for forming the first metal layer 34. Also, when the substrate 10 is dipped, the electroless plating liquid may not be stirred, and the substrate 10 may preferably be maintained in a stationary state. In this manner, the second metal layer 36 having a desired thickness (of about 5-50% of the total thickness of the metal layer 33) can be formed on the top surface of the first metal layer 34 over the substrate 10 (step S16).

Figure 10:
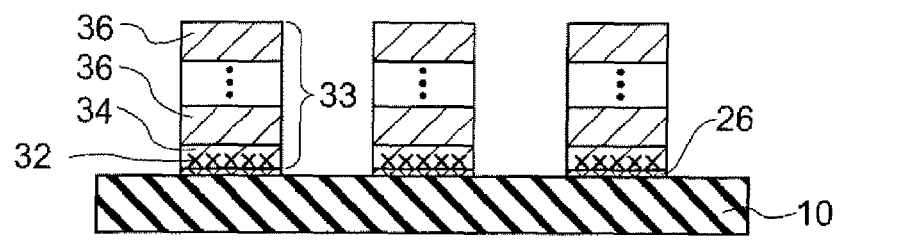
FIG. 10 is a view showing a step of the method for manufacturing a wiring substrate in accordance with the first embodiment.

(8) Step S15 and step S16 described above may be repeated until the metal layer 33 reaches a desired thickness (step S17), whereby the wiring substrate 100 shown in FIG. 10 is fabricated. It is noted that an appropriate number of repetition of step S15 and step S16 may preferably be decided in advance. As step S15 and step S16 are repeated, a plurality of the second metal layers 36 are formed. In this instance, the dipping time may preferably be adjusted such that the film thickness of each of the second metal layers 36 is generally constant. Accordingly, if the growth rate of each metal layer becomes greater with an increase in the number of the second metal layers 36, the dipping time to dip the substrate 10 in the electroless plating liquid may preferably be made gradually shorter as step S16 is repeated. In other words, the dipping time to dip the substrate 10 in the electroless plating liquid at n-th time may preferably be shorter than the dipping time to dip the substrate 10 in the electroless plating liquid at (n−1)th time.

By the steps described above, the wiring substrate 100 is fabricated. According to the method for manufacturing the wiring substrate 100 in accordance with the present embodiment, precipitation and washing with water of metal layers are repeatedly conducted. According to this method, while suppressing plating precipitation in the plane direction of the substrate, metal layers can be grown in the thickness direction of the substrate, such that gaps of wiring patterns can be prevented from being embedded by the metal layers. Accordingly, wirings can be accurately formed in high-density.

A water film is provided on the surface of the substrate 10 at the time of washing the substrate 10 with water. Then, when the substrate 10 is dipped in an electroless plating liquid, the concentration of the electroless plating liquid near the substrate 10, in particular, near the gaps between the first metal layers 34 can be temporarily lowered at an initial stage. It is believed that, as the concentration of the electroless plating liquid is lowered in a manner described above, plating precipitation is delayed, and plating precipitation is suppressed in the plane direction of the substrate.

In particular, as described above, when the substrate 10 is dipped in the electroless plating liquid for forming the second metal layer 36, the electroless plating liquid is not stirred and the substrate 10 is maintained in a stationary state, such that the time for the water film formed by the washing with water to exist near the substrate 10 can be prolonged. By this, precipitation of plating metal in the plane direction of the substrate can be further delayed.

It is noted that, in the reaction of precipitation of a metal layer by electroless plating, a metal layer is scarcely formed at an initial stage immediately after a substrate is dipped in an electroless plating liquid, and a metal coating would be formed initially after a certain dipping time passes. Then, in a middle stage, the film thickness of the metal layer exponentially increases, and then the thickness of the metal layer gently increases after the thickness reaches a certain thickness. It is assumed that the precipitation reaction in the plane direction of the substrate would be fast in the middle stage. Accordingly, before the precipitation reaction in the middle stage is completed, in other words, while the thickness of the metal layer is exponentially increasing, the substrate 10 may preferably be taken out of the electroless plating liquid and washed with water. By this, the plating precipitation reaction in the plane direction of the substrate can be delayed.

1.2. Electronic Device

Figure 11:
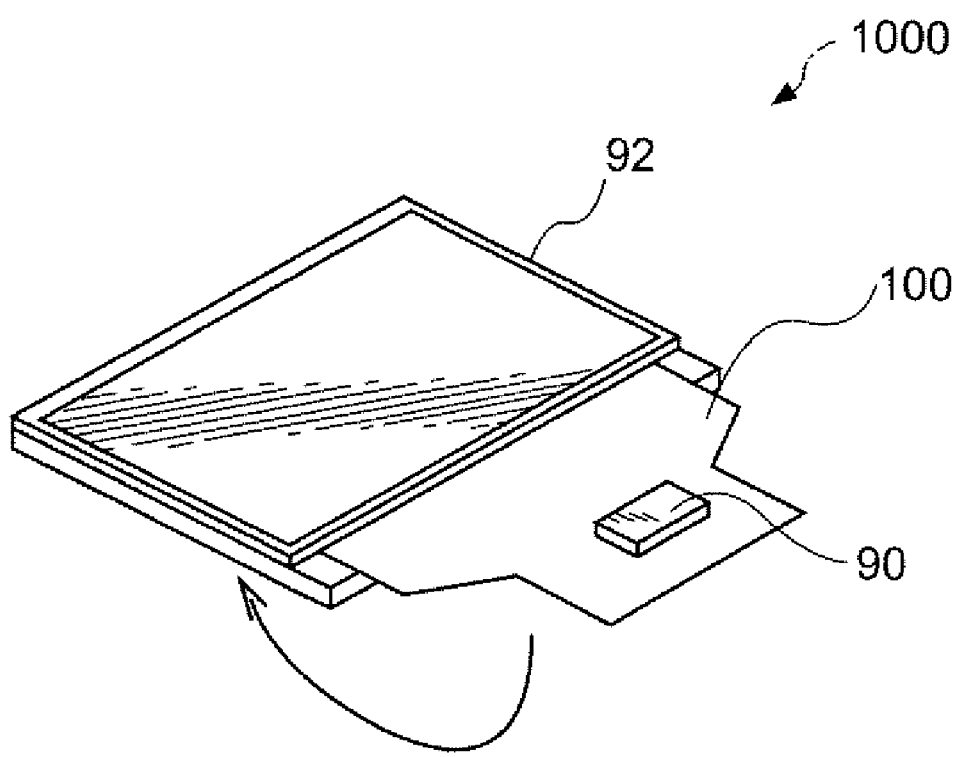
FIG. 11 is a view showing an example of an electronic device that uses a wiring substrate in accordance with the first embodiment.

FIG. 11 shows an example of an electronic device that uses a wiring substrate manufactured by the method for manufacturing a wiring substrate in accordance with the first embodiment. An electronic device 1000 includes a wiring substrate 100, an integrated circuit chip 90 and another substrate 92.

Wiring patterns formed on the wiring substrate 100 may electrically connect electronic components to one another. The wiring substrate 100 is manufactured by the manufacturing method described above. In the example shown in FIG. 11, the integrated circuit chip 90 is electrically connected to the wiring substrate 100, and an end section of the wiring substrate 100 is electrically connected to the other substrate 92 (for example, a display panel). The electronic device 1000 may be a display device, such as, for example, a liquid crystal display device, a plasma display device, an El (Electro Luminescence) display device or the like.

1.3. First Experimental Example

Wiring substrates were fabricated according to the method for manufacturing a wiring substrate in accordance with the first embodiment.

(1) A photoresist film is formed on a glass substrate, and then the photoresist film is exposed and developed by a direct-writing method in straight stripes, each having a width of about 1 µm, at a pitch of about 1.5 µm, whereby a photoresist having linear lines each having a width of about 1 µm, and opening sections in stripe at an interval of about 0.5 µm was formed.

(2) The glass substrate was cut into 1 cm square pieces, and dipped in a cationic system surface-active agent solution (e.g., FPD conditioner manufactured by Technic Japan Inc.). Then, the glass substrate was dipped in a palladium catalyst solution with a palladium concentration of 0.005-0.05 g/l, and a pH of 4.5-6.8. Then, the photoresist on the glass substrate was removed by an organic solvent such as acetone. As a result, a catalyst layer in stripes having linear lines, each having a width of about 1 µm, at an interval of about 0.5 µm was formed.

(3) Next, the glass substrate with the catalyst layer formed thereon was dipped in a nickel electroless plating liquid at 80° C. for 30 seconds (first time), thereby forming a nickel metal layer having a thickness of about 20 nm, and a width of about 0.8 µm.

(4) Then, the glass substrate was washed with pure water at room temperature, and immediately thereafter, the glass substrate was dipped in a nickel electroless plating liquid at 80° C. for 30 seconds (second time).

(5) The step (4) was repeated ten times, whereby a nickel metal layer having a thickness of about 200 nm was finally formed on the glass substrate. In this instance, the dipping time in the nickel electroless plating liquid was 20 seconds for the third-fourth time, 10 seconds for the fifth-seventh time, and 5 seconds for the eighth time-tenth time. The nickel metal layer was in stripes with straight lines, each having a width of about 1.2 µm, at an interval of about 0.3 µm.

1.4. Second Experimental Example (Comparison Example)

A photoresist film is formed on a glass substrate, and then the photoresist film is exposed and developed by a direct-writing method in straight stripes, each having a width of about 1 µm, at a pitch of about 1.5 µm, whereby a photoresist having linear lines each having a width of about 1.0 µm, and opening sections in stripes at an interval of about 0.5 µm was formed. Then, the glass substrate was cut into 1 cm square pieces, and dipped in a cationic system surface-active agent solution (e.g., FPD conditioner manufactured by Technic Japan Inc.). Then, the glass substrate was dipped in a palladium catalyst solution with a palladium concentration of 0.005-0.05 g/l, and a pH of 4.5-6.8. Then, the photoresist on the glass substrate was removed by an organic solvent such as acetone. As a result, a catalyst layer in stripes having linear lines, each having a width of about 1.0 µm, at an interval of about 0.5 µm was formed.

Next, the glass substrate with the catalyst layer formed thereon was dipped in a nickel electroless plating liquid at 80° C. for 3 minutes (first time), thereby forming a nickel metal layer having a thickness of about 200 nm. As a result, adjacent ones of the linear lines in the formed nickel metal layer are connected to each other, which formed a state without gaps, in other words, a continuous plane.

2. Second Embodiment

A method for manufacturing a wiring substrate in accordance with a second embodiment further includes the step of drying the substrate 10 after the step (6) described above (step S15), and is therefore different in this respect from the method for manufacturing a wiring substrate in accordance with the first embodiment.

2.1. Method for Manufacturing Wiring Substrate

Figure 12:
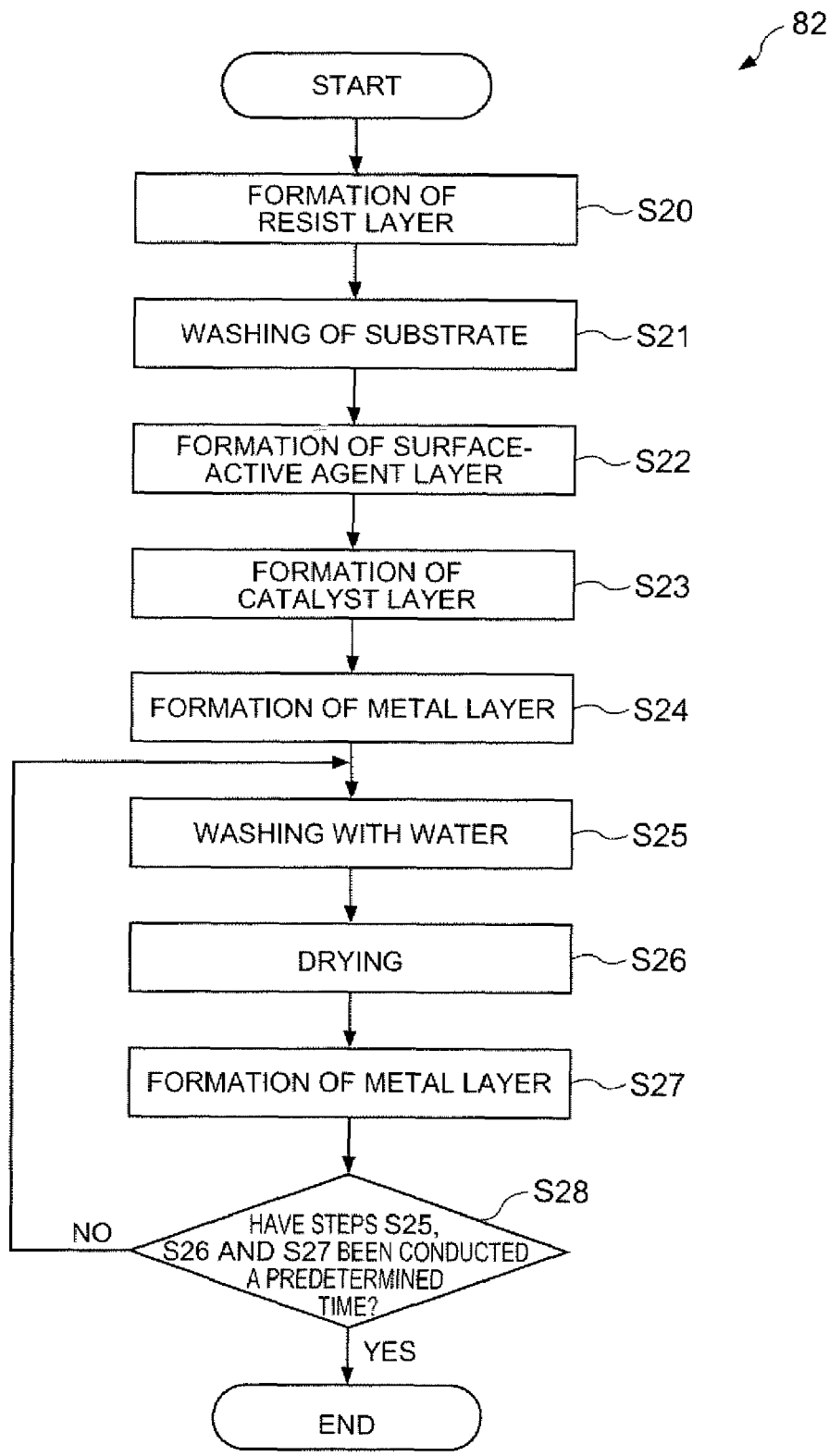
FIG. 12 is a flow chart showing an outline of a method for manufacturing a wiring substrate in accordance with a second embodiment of the invention.

FIG. 12 is a flow chart 82 showing an outline of a method for manufacturing a wiring substrate in accordance with a second embodiment of the invention.

First, a substrate 10 is prepared, and a resist layer 22 is formed in a region other than a desired wiring pattern (step S20). Then, the substrate 10 is washed (step S21). Next, a surface-active agent layer 24 is formed on the substrate 10 by the method described above (step S22), and a catalyst layer 32 having a predetermined pattern is formed (step S23).

Then, by dipping the substrate 10 in an electroless plating liquid, a first metal layer 34 is formed on the catalyst layer 32 (step S24), and then the substrate 10 is washed with water (step S25). The washing with water may be conducted by, for example, dipping the substrate 10 in pure water.

Next, moisture on the surface of the substrate 10 is removed (step S26). The removal of moisture may be conducted by, for example, naturally drying the substrate 10 at room temperature, or blowing compressed air to remove water droplets. Air may preferably be blown against the substrate 10 downwardly from above. This can prevent the metal layer that has been already provided from peeling off. Also, by removing water droplets by blowing compressed air, moisture on the substrate 10 can be quickly removed, and highly viscous moisture containing plating composition can be readily removed. After the substrate 10 is dried, the substrate 10 may be placed and dried, for example, in an oven at 90° C.-120° C. for ten minutes to one hour, thereby applying a heat treatment to the substrate 10. By the heat treatment, adhesion between the substrate and the metal layer 33 can be improved. Then, by dipping the substrate 10 in an electroless plating liquid, a second metal layer 36 is formed on the first metal layer 34 (step S27).

Step S25, step S26 and step S27 described above are repeated until the metal layer 33 reaches a desired thickness (step S28), whereby a wiring substrate 100 is manufactured. Through repeating step S25, step S26 and step S27, a plurality of the second metal layers 36 are formed. In this instance, the dipping time for dipping in the electroless plating liquid may be made shorter each time step S27 is repeated. Also, the heat treatment after the drying step may be conducted according to the requirements, and may be conducted only once after the drying step in the first time.

By the process described above, the wiring substrate in accordance with the second embodiment can be fabricated. According to the method for manufacturing a wiring substrate in accordance with the second embodiment, moisture is removed by blowing air after the substrate is washed with water, such that minute surface areas, such as, gaps in the first metal layers 34 and gasp in the second metal layers 36 can be sufficiently washed. It is noted that the plating composition in areas adjacent to the substrate 10, in particular, adjacent to gaps between the first metal layers 34 is almost completely removed in advance, such that, when the substrate 10 is dipped later in an electroless plating liquid, the concentration of the electroless plating liquid in the adjacent areas can be temporarily lowered. Precipitation in plating is assumed to be delayed by lowering the concentration of the electroless plating liquid. Accordingly, the metal layer can be grown in its thickness direction while suppressing precipitation in plating in a plane direction of the substrate, such that the gaps in the wiring pattern can be prevented from being embedded with a metal layer. Therefore, high-density wirings can be accurately formed.

It is noted that details of each of the steps described above are generally the same as those of the corresponding steps in the first embodiment, and therefore their description is omitted.

3. Third Embodiment

A method for manufacturing a wiring substrate in accordance with a third embodiment further includes, after the step (6) (step S15) in the first embodiment described above, the steps of drying the substrate 10 and thereafter washing the substrate 10 again with water, and is therefore different in this respect from the method for manufacturing a wiring substrate in accordance with the first embodiment.

3.1. Method For Manufacturing Wiring Substrate

Figure 13:
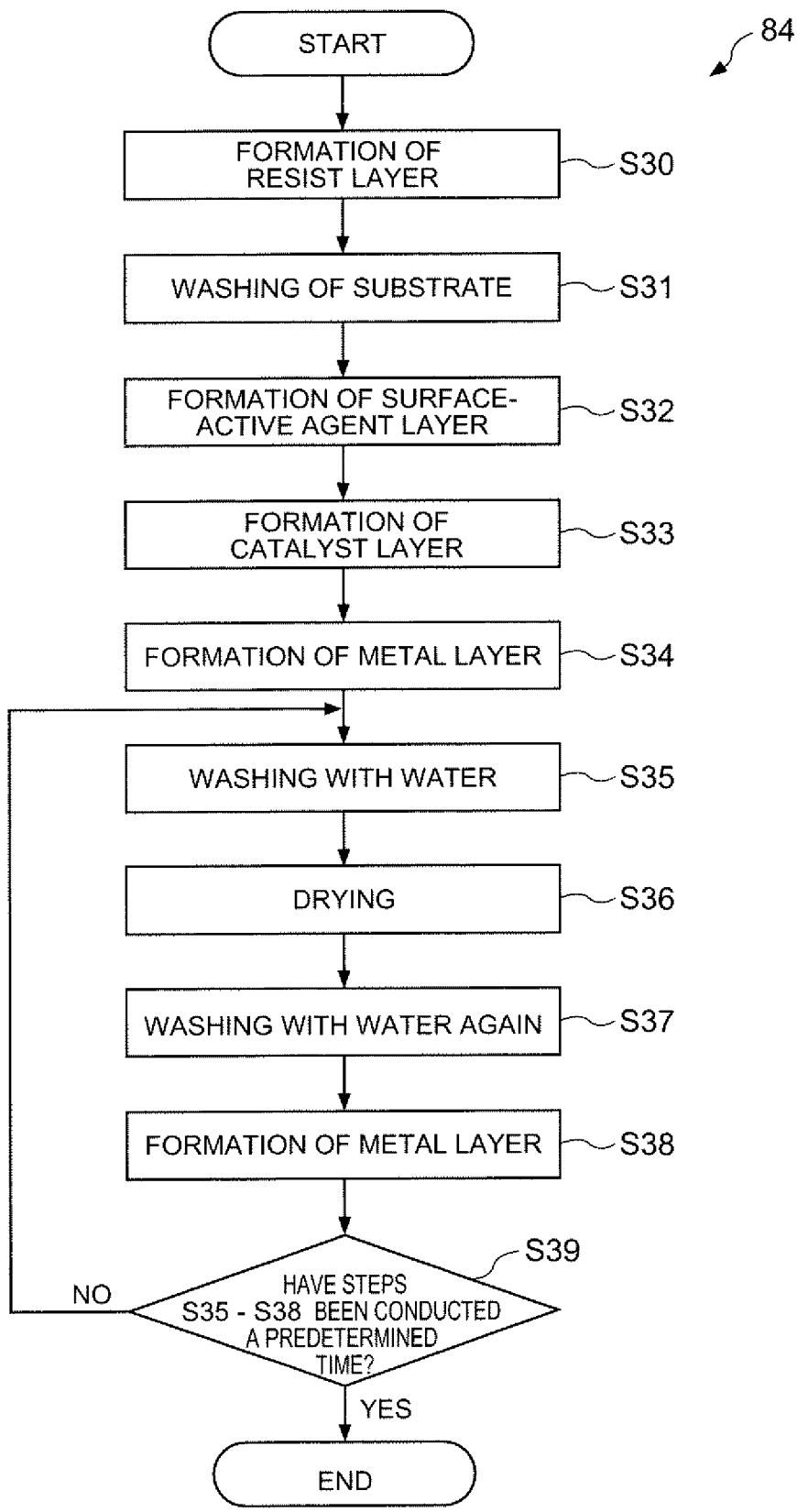
FIG. 13 is a flow chart showing an outline of a method for manufacturing a wiring substrate in accordance with a third embodiment of the invention.

FIG. 13 is a flow chart 84 showing an outline of a method for manufacturing a wiring substrate in accordance with the third embodiment of the invention.

First, a substrate 10 is prepared, and a resist layer 22 is formed in a region other than a desired wiring pattern (step S30). Then, the substrate 10 is washed (step S31). Next, a surface-active agent layer 24 is formed on the substrate 10 by the method described above (step S32), and a catalyst layer 32 having a predetermined pattern is formed (step S33).

Then, by dipping the substrate 10 in an electroless plating liquid, a first metal layer 34 is formed on the catalyst layer 32 (step S34), and then the substrate 10 is washed with water (step S35). The washing with water may be conducted by, for example, dipping the substrate 10 in pure water.

Next, moisture on the surface of the substrate 10 is removed (step S36). The removal of moisture may be conducted by, for example, naturally drying the substrate 10 at room temperature, or blowing compressed air to remove water droplets. Air may preferably be blown against the substrate 10 downwardly from above. This can prevent the metal layer that has been already provided from peeling off. Also, by removing water droplets by blowing compressed air, moisture on the substrate 10 can be quickly removed, and highly viscous moisture containing plating composition can be readily removed. After the removal of moisture, the substrate 10 may be placed, for example, in an oven at 90° C.-120° C. for about ten minutes to about one hour, thereby applying a heat treatment to the substrate 10. By the heat treatment, adhesion between the substrate and the metal layer 33 can be improved.

Then, the substrate 10 is washed with water again (step S37). The washing with water may be conducted by, for example, dipping the substrate 10 in pure water. Next, by dipping the substrate in an electroless plating liquid, a second metal layer 36 is formed on the first metal layer 34 (step S38).

Step S35, step S36, step S37 and step S38 described above are repeated until the metal layer 33 reaches a desired thickness (step S39), whereby a wiring substrate is manufactured. Through repeating step S35, step S36, step S37 and step S38, a plurality of the second metal layers 36 are formed. In this instance, the dipping time for dipping in the electroless plating liquid may be made shorter each time step S38 is repeated. Also, the heat treatment after the drying step may be conducted according to the requirements, and may be conducted only once after the drying step in the first time.

Also, in step S38, when the substrate 10 is dipped, the electroless plating liquid may not be stirred, and the substrate 10 may preferably be maintained in a stationary state. By this, the time for a water film formed by the washing with water to exist near the substrate 10 can be prolonged. By this, precipitation in plating in the plane direction of the substrate can be further delayed.

By the process described above, the wiring substrate in accordance with the third embodiment can be fabricated. According to the method for manufacturing a wiring substrate in accordance with the third embodiment, moisture is removed by blowing air after the substrate is washed with water, and then the substrate is washed with water again, such that minute surface areas, such as, gaps in the first metal layers 34 and gasp in the second metal layers 36 can be sufficiently washed, and water droplets can be adhered to the surface areas. Therefore, when the substrate 10 is dipped later in an electroless plating liquid, the concentration of the electroless plating liquid in areas adjacent to the surface areas can be further lowered. Precipitation in plating is assumed to be delayed by lowering the concentration of the electroless plating liquid. Accordingly, the metal layer can be grown in its thickness direction while suppressing precipitation in plating in a plane direction of the substrate, such that the gaps in the wiring pattern can be prevented from being embedded with a metal layer. Therefore, high-density wirings can be accurately formed.

It is noted that details of each of the steps described above are generally the same as those of the corresponding steps in the first embodiment, and therefore their description is omitted.

The invention is not limited to the embodiments described above, and many modifications can be made. For example, in the embodiments described above, a resist layer is provided in advance in a region other than a desired pattern region on a substrate, a surface-active agent layer and a catalyst layer are formed over the entire surface, and then, the resist layer is removed, whereby the catalyst layer is formed in a predetermined region. Instead of the above, the catalyst layer may be formed without using the resist layer. Concretely, for example, a surface-active agent layer may be formed on the entire surface of a substrate, a portion of the surface-active agent layer may be photodecomposed thereby leaving the surface-active agent layer only in a desired pattern region. By this, a catalyst layer can be formed only in the desired pattern region. For the photodecomposition of the surface-active agent layer, vacuum ultraviolet (VUV) ray may be used. By setting the light, for example, to a wavelength of 170 nm-260 nm, the interatomic bonds (such as, for example, C—C, C=C, C—H, C—F, C—Cl, C—O, C—N, O=O, O—H, H—F, H—Cl, and N—H) can be broken down. By using the light in the aforementioned wavelength band, facility such as a yellow-room becomes unnecessary, and the series of steps in accordance with the present embodiment can be conducted in, for example, white light.

Also, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A method of manufacturing a wiring substrate including a first portion, a second portion, and a third portion, the third portion being positioned between the first portion and the second portion, the method comprising:
   forming a resist film on a substrate;
   patterning the resist film to form a resist portion, a first non-resist portion, and a second non-resist portion, the resist portion being positioned between the first non-resist portion and the second non-resist portion;
   forming a surface active film on the resist portion, the first non-resist portion, and the second non-resist portion;
   forming a catalyst film on the surface active film;
   removing the resist film together with the surface active film and the catalyst film formed on the resist portion to expose the third portion;
   forming a first metal film on the first portion and the second portion by dipping the substrate in an electroless plating solution;
   forming a water film on a surface of the third portion; and
   forming a second metal film on the first metal film by dipping the substrate in the electroless plating solution.

2. The method of claim 1, further comprising:
   washing the substrate after the forming of the catalyst film on the surface active film; and
   drying the substrate before the removing of the resist film.

3. The method of claim 1, further comprising:
   washing the substrate after the patterning of the resist film; and
   drying the substrate before the forming of the surface active film.

4. The method of claim 3, the washing of the substrate including washing the substrate with water.

5. The method of claim 3, the washing of the substrate including washing the substrate by dry washing.

6. The method of claim 1, a dipping duration of the substrate in the electroless plating solution to form the second metal film being shorter than a dipping duration of the substrate in the electroless plating solution to form the first metal film.

7. A method of manufacturing a wiring substrate including a first portion, a second portion, and a third portion, the third portion being positioned between the first portion and the second portion, the method comprising:
   forming a resist film on a substrate;
   patterning the resist film to form a resist portion, a first non-resist portion, and a second non-resist portion, the resist portion being positioned between the first non-resist portion and the second non-resist portion;
   forming a surface active film on the resist portion, the first non-resist portion, and the second non-resist portion;
   forming a catalyst film on the surface active film;
   removing the resist film together with the surface active film and the catalyst film formed on the resist portion to expose the third portion;
   forming a first metal film on the first portion and the second portion by dipping the substrate in an electroless plating solution;
   washing the substrate;
   drying the substrate; and
   forming a second metal film on the first metal film by dipping the substrate in the electroless plating solution.

8. The method of claim 7, further comprising:
   heating the substrate after the drying of the substrate.

9. The method of claim 7, further comprising:
   washing the substrate after the forming of the catalyst film; and
   drying the substrate before the removing of the resist film.

10. The method of claim 7, further comprising:
    washing the substrate after the patterning of the resist film; and
    drying the substrate before the forming of the surface active film.

11. The method of claim 10, the washing of the substrate after the patterning of the resist film including washing the substrate with water.

12. The method of claim 10, the washing of the substrate after the patterning of the resist film including washing the substrate by dry washing.

13. The method of claim 7, a dipping duration of the substrate in the electroless plating solution to form the second metal film being shorter than a dipping duration of the substrate in the electroless plating solution to form the first metal film.

14. A method of manufacturing a wiring substrate including a first portion, a second portion, and a third portion, the third portion being positioned between the first portion and the second portion, the method comprising:
    forming a resist film on a substrate;
    patterning the resist film to form a resist portion, a first non-resist portion, and a second non-resist portion, the resist portion being positioned between the first non-resist portion and the second non-resist portion;
    forming a surface active film on the resist portion, the first non-resist portion, and the second non-resist portion;
    forming a catalyst film on the surface active film;
    removing the resist film together with the surface active film and the catalyst film formed on the resist portion to expose the third portion;
    forming a first metal film on the first portion and the second portion by dipping the substrate in an electroless plating solution;
    washing the substrate;
    drying the substrate;
    forming a water film on the third portion; and
    forming a second metal film on the first metal film by dipping the substrate in the electroless plating solution.

15. The method of claim 14, further comprising:
    heating the substrate after the drying of the substrate.

* * * * *